United States Patent
Heise

(10) Patent No.: US 7,900,119 B2
(45) Date of Patent: Mar. 1, 2011

(54) INTERLEAVING REDUNDANCY APPARATUS AND METHOD

(75) Inventor: Bernd Heise, Munich (DE)

(73) Assignee: Lantiq Deutschland GmbH, Neubiberg (DE)

( * ) Notice: Subject to any disclaimer, the term of this patent is extended or adjusted under 35 U.S.C. 154(b) by 474 days.

(21) Appl. No.: 12/049,164

(22) Filed: Mar. 14, 2008

(65) Prior Publication Data

US 2009/0144590 A1 Jun. 4, 2009

Related U.S. Application Data

(60) Provisional application No. 60/991,645, filed on Nov. 30, 2007.

(51) Int. Cl.
*G11C 29/00* (2006.01)
(52) U.S. Cl. .......................... 714/763; 714/791
(58) Field of Classification Search .................. 370/468; 341/94; 375/222, 219; 714/702, 701, 755, 714/763, 791
See application file for complete search history.

(56) References Cited

U.S. PATENT DOCUMENTS

| | | | |
|---|---|---|---|
| 5,719,875 A | 2/1998 | Wei | |
| 5,838,267 A * | 11/1998 | Wang et al. | 341/94 |
| 5,898,710 A | 4/1999 | Amrany | |
| 5,928,371 A * | 7/1999 | Robinson et al. | 714/702 |
| 6,351,832 B1 * | 2/2002 | Wei | 714/701 |
| 6,473,878 B1 * | 10/2002 | Wei | 714/755 |
| 7,050,458 B1 * | 5/2006 | Lifshitz et al. | 370/468 |
| 2003/0105996 A1 | 6/2003 | Dagan et al. | |
| 2004/0268207 A1 | 12/2004 | Sharma | |
| 2007/0047633 A1 * | 3/2007 | Tung et al. | 375/222 |

* cited by examiner

*Primary Examiner* — David Ton
(74) *Attorney, Agent, or Firm* — Eschweiler & Associates, LLC

(57) ABSTRACT

One embodiment of the invention relates to a network communication device. The network communication device includes a network interface configured to receive an initial data stream. The network communication device also includes an interleaving redundancy encoder that comprises a memory unit arranged in N columns and D rows. The interleaving redundancy encoder is configured to calculate at least one redundancy byte based on a series of equally spaced, non-consecutive bytes in the initial data stream, where a number of bytes between equally spaced bytes is approximately equal to D−1. Other systems and methods are also disclosed.

20 Claims, 9 Drawing Sheets

INTERLEAVING REDUNDANCY APPARATUS AND METHOD

RELATED APPLICATION

This application claims priority to U.S. Provisional Application Ser. No. 60/991,645 filed Nov. 30, 2007, entitled "INTERLEAVING REDUNDANCY APPARATUS AND METHOD."

FIELD OF INVENTION

The present invention relates generally to communication systems and more particularly to communication methods for adapting to noise conditions.

BACKGROUND OF THE INVENTION

Digital subscriber line (DSL) technology provides high-speed data transfer between two modems across ordinary telephone lines (e.g., twisted pair of copper wires), while still providing for plain old telephone service (POTS). Asynchronous Digital Subscriber Line (ADSL) and Very High Digital Subscriber Line (VDSL) have emerged as popular implementations of DSL systems, where ADSL is defined by American National Standard Institute (ANSI) standard T1.413 and International Telecommunication Union (ITU-T) standards G.992.3, G.992.5, and VDSL is defined by ANSI standard T1.424 and ITU-T standard G.993.1. ADSL, VDSL and other similar DSL systems (collectively referred to as "xDSL") typically provide digital data transfer in a frequency range above the POTS band (e.g., about 300 Hz to 4 kHz), for example ADSL G.992.3 operates at frequencies from about 25 kHz to about 1.1 MHz.

One feature of DSL modems that allows them to provide high data rates is their ability to communicate symbols over a multi-carrier channel 100, such as shown in FIG. 1. The illustrated multi-carrier channel 100 includes a number of frequencies or "carriers" 102 (e.g., carriers $f_1, f_2, \ldots f_N$) that span a frequency spectrum 104 supported by the telephone line. In effect, by breaking the frequency spectrum 104 into multiple carriers, the DSL modems can transmit data over each of the carriers (instead of just a single carrier), thereby allowing them to "stuff" more data through the phone line per unit time.

During communication, a specific number of bytes per unit time may be transmitted on each carrier based on a signal-to-noise ratio (SNR) 106. Typically, more bytes are transmitted on carriers that have a relatively high SNR, while fewer bytes are transmitted on frequencies that have a relatively low SNR. For example, carrier $f_2$ has a relatively high SNR compared to carrier $f_4$. Correspondingly, the DSL modems transmit more bytes on carrier $f_2$ (i.e., approximately 18 bytes per unit time), and fewer bytes on carrier $f_4$ (i.e., approximately 14 bytes per unit time). Although encoding and decoding data conveyed on multiple frequencies makes this multi-carrier communication computationally complex, it gives the DSL modems the ability to provide users with high speed data connections with relatively few errors.

Although a multi-carrier channel affords DSL communication systems some ability to account for particularly noisy regions of the frequency spectrum, other components are typically used to account for more dynamic noise sources, such as impulse noise. Therefore, to achieve high data rates with high accuracy, improvements can be made to allow communication systems to communicate more efficiently.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

One embodiment of the invention relates to a network communication device. The network communication device includes a network interface configured to receive an initial data stream. The network communication device also includes an interleaving redundancy encoder that comprises a memory unit arranged in N columns and D rows. The interleaving redundancy encoder is configured to calculate at least one redundancy byte based on a series of equally spaced, non-consecutive bytes in the initial data stream, where a number of bytes between equally spaced bytes is approximately equal to D−1.

The following description and annexed drawings set forth in detail certain illustrative aspects and implementations of the invention. These are indicative of only a few of the various ways in which the principles of the invention may be employed.

DETAILED DESCRIPTION OF THE INVENTION

Figure 1:
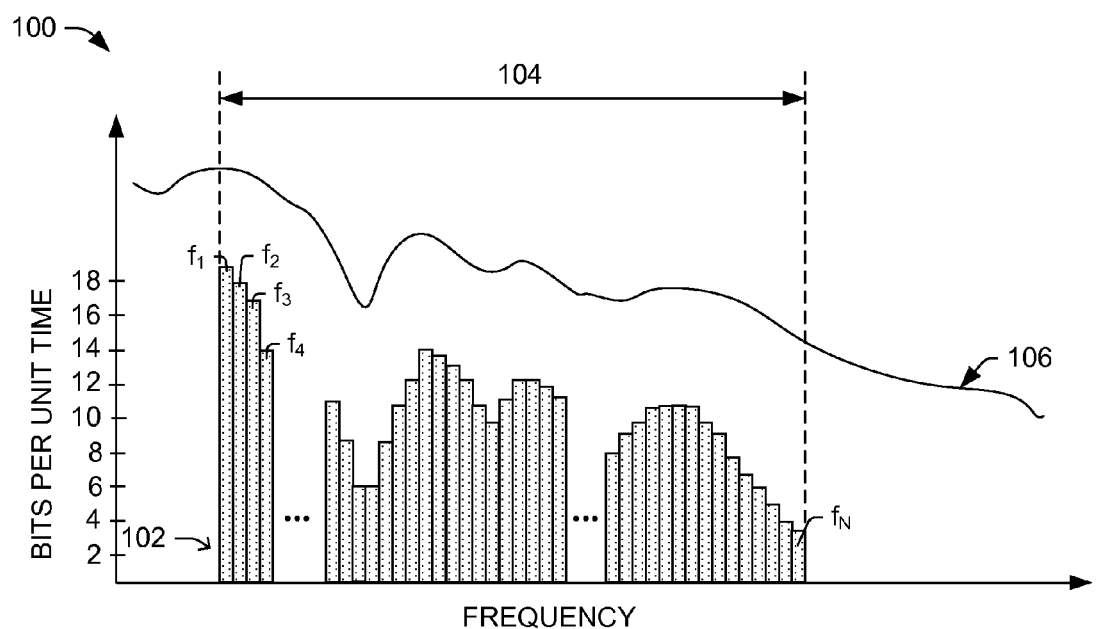
FIG. 1 is a schematic diagram illustrating a DSL communication system where modems communicate data over a multi-carrier channel.

One or more implementations of the present invention will now be described with reference to the attached drawings, wherein like reference numerals are used to refer to like elements throughout. Although some aspects may be discussed below in the context of a DSL communication system, the invention is applicable any type of communication system where interleaving may be employed.

Figure 2:
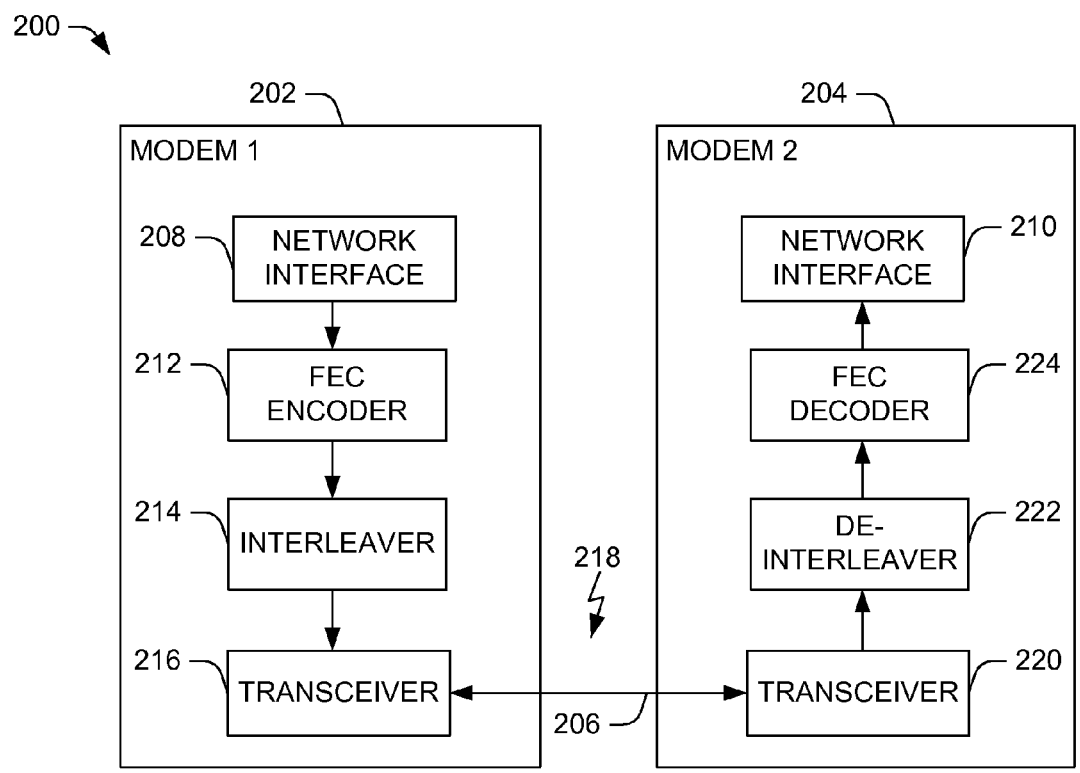
FIG. 2 is a schematic diagram illustrating a DSL communication system with first and second DSL modems that communicate over a twisted pair of copper wires.

FIG. 2 shows a DSL communication system 200 that includes first and second DSL modems 202, 204, respectively, coupled to a standard phone line 206 (e.g., twisted pair of copper wires). As previously mentioned, the DSL modems 202, 204 can transfer data via symbols over a multi-carrier communication channel established over the phone line 206. To exchange data, the modems 202, 204 include network interfaces 208, 210, respectively, that interface to a higher level protocol (e.g., TCP/IP). A brief description of data exchange is now provided with reference to FIG. 2 and a more detailed discussion will follow with reference to FIG. 3.

Referring now to FIG. 2, to transmit data, the transmitting network interface 208 receives payload data and passes it to a forward error correction (FEC) encoder 212, where the FEC encoder appends redundancy bytes to the payload data to form a codeword. An interleaver 214 then interleaves successive codewords with one another to form an interleaved data stream. A transceiver 216 can then modulate the interleaved data stream over the line 206 by applying trellis encoding, inverse Fourier transforms, and the like. Noise 218, such as an impulse noise disturbance, may affect the modulated interleaved data stream on the line, potentially corrupting the data.

To receive data, a transceiver 220 in the receiving modem 204 demodulates the modulated interleaved data stream by applying fast Fourier transforms, Trellis decoding, etc. The transceiver 220 then passes the demodulated interleaved data stream to a de-interleaver 222. The de-interleaver 222 then un-mixes the bytes of the interleaved codewords, after which a FEC decoder 224 uses the redundancy bytes to attempt to correct any data errors that occurred on the line 206. Finally, the corrected data is passed to the receiving network interface 210 where it can be used for its desired purpose.

Figure 3:
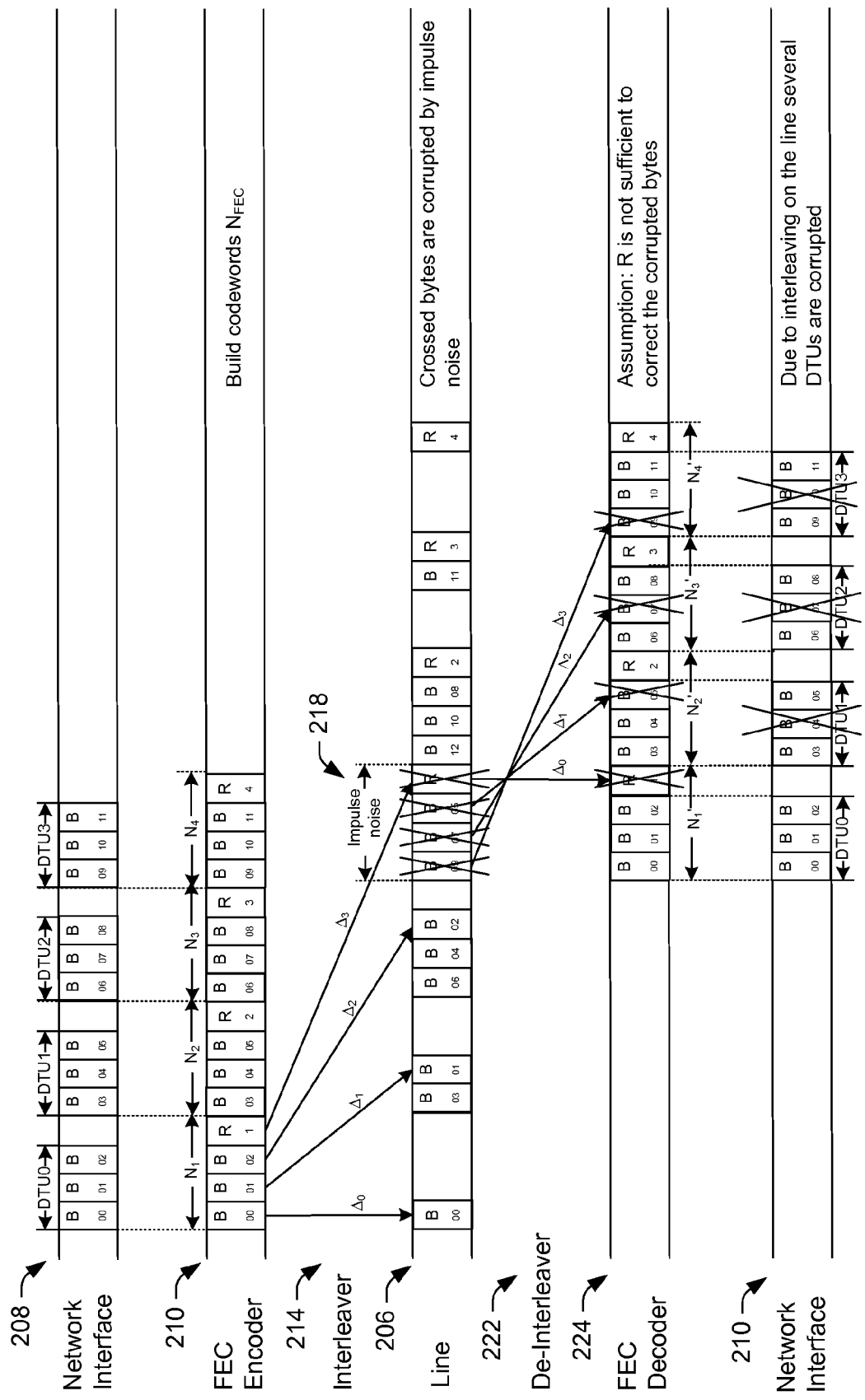
FIG. 3 is a diagram illustrating how an impulse noise disturbance can cause corrupted data bytes to be distributed over multiple data transmission units.

In most cases, the FEC encoder 212 and interleaver 214 work in conjunction with the de-interleaver 222 and FEC decoder 224 to reliably correct any corrupted bytes in the payload data. However, in some circumstances the combination of interleaving and redundancy bytes may be insufficient to correct the corrupted bytes. For example, FIG. 3 shows a scenario where four data transmission units (DTUs) are transmitted from network interface 208, three of which are corrupted when received at the network interface 210. These corrupted DTUs are due to an impulse noise event 218 that has a duration that exceeds the minimum impulse noise protection ($INP_{min}$) of the system. Due to the interleaving, these corrupted data bytes are spread across multiple DTUs at the network interface 210.

More specifically, in FIG. 3's example, one can see that the transmitting network interface 208 supplies several DTUs (DTU0, DTU1, DTU2, DTU3), where each DTU includes three bytes (B) of payload data. The transmitting FEC encoder 210 then calculates one redundancy byte (R) for each DTU and appends the redundancy byte that DTU to form a codeword having a codeword size (N) of 4 bytes. For example, codeword $N_1$ includes DTU0's payload bytes $B_{00}$, $B_{01}$, and $B_{02}$, as well as redundancy byte $R_1$, which is calculated from DTU0's payload bytes. The codeword $N_1$ is then spread in time using the interleaver 214, after which the transceiver 216 transmits the interleaved codewords over the line 206. In this example for the sake of simplicity, codewords are framed so that each codeword is transmitted as a single symbol on the line.

An impulse noise disturbance 218 occurs on the line 206, as indicated by the crossed-out bytes. As can be seen in the figure, the impulse noise corrupts all the data in a single symbol. Thus, in FIG. 3's example, the impulse noise disturbance 218 corrupts a single codeword, which includes three payload bytes ($B_{09}$, $B_{07}$, $B_{05}$) and one redundancy byte ($R_1$).

In the receiving modem, the transceiver demodulates the data from the line 106 and the de-interleaver 222 de-interleaves received data, resulting in the codewords ($N_1'$, $N_2'$, $N_3'$, $N_4'$). The FEC decoder 224 then calculates redundancy bytes based on received payload bytes, which may or may not be equal to the transmitted payload bytes due to noise on the line. If the redundancy bytes calculated by the FEC decoder are not equal to the received redundancy bytes, the FEC encoder can use the redundancy bytes in a given codeword to attempt to correct the corrupted bytes. Thus, redundancy byte $R_1$ would typically be used to correct any errors that occur in payload bytes $B_{00}$, $B_{01}$, and $B_{02}$. However, as clearly seen, if R is insufficient to correct the corrupted bytes, three of the four DTUs are corrupted due to the impulse noise disturbance 218.

If the redundancy bytes cannot correct the errors in payload data, typical higher layer protocols (e.g., TCP/IP), must retransmit each corrupted DTU. This flood of retransmission requests may, in some cases, overload the retransmission capabilities of the servers and result in non-corrected errors in the network.

Figure 4:
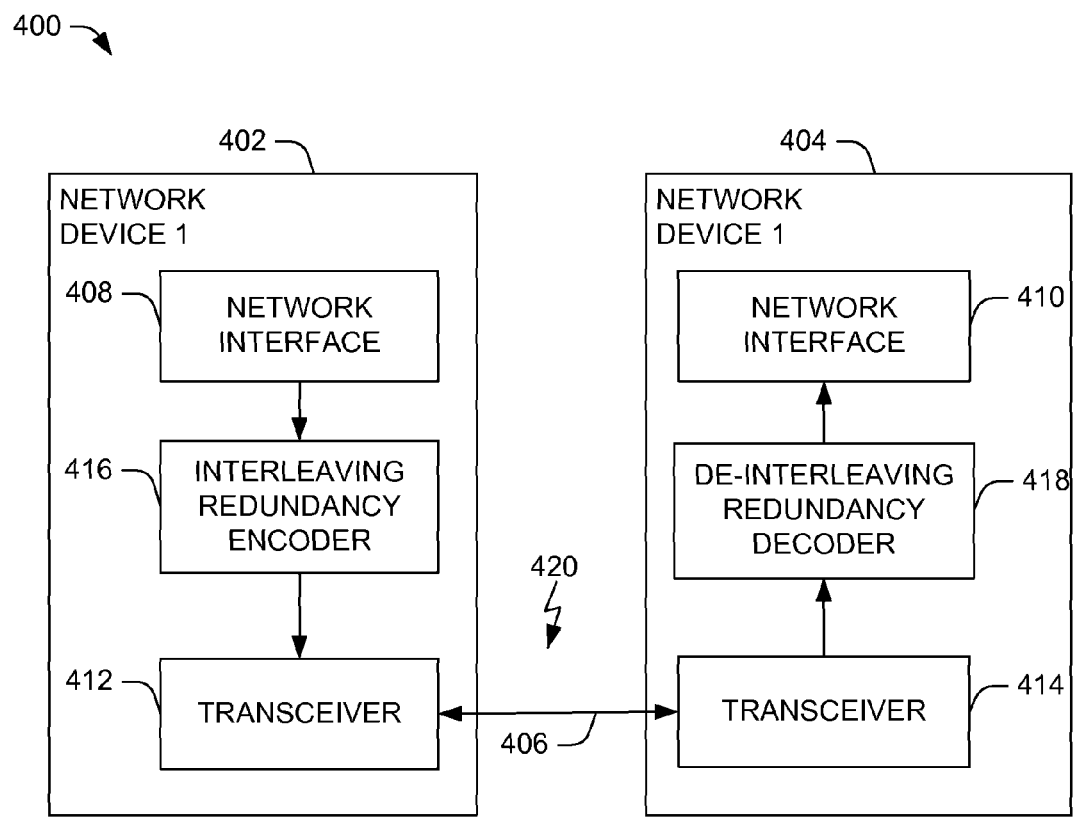
FIG. 4 is a schematic diagram illustrating a communication system with first and second network devices coupled to a transmission medium in accordance with aspects of the present invention.

In appreciating the above problems or limitations associated with the previously described interleaver systems and methods, the inventors have developed interleaver systems and methods that, together with redundancy coding, limit the number of DTUs corrupted over the network. FIG. 4 shows one embodiment of such a communication system 400 that includes first and second network communication devices 402, 404, respectively, coupled to a transmission medium 406. In one embodiment the communication devices 402, 404 could comprise DSL modems that communicate over a multi-carrier channel supported by a standard phone line. In other embodiments, however, the communication devices 402, 404 could comprise other communication devices, such as cellular phones, pagers, laptops, etc., that communicate over a wireline or wireless transmission medium.

Like the previously discussed DSL modems 202, 204, the communication devices 402, 404 may include network interfaces 408, 410, respectively, that may interface to a higher level protocol. The communication devices 402, 404 may also include transceivers 412, 414, respectively, that are configured to transmit and/or receive information over the transmission medium 406.

Unlike the previously described DSL modems, however, the communication devices 402, 404 also include an interleaving redundancy encoder 416 and a de-interleaving redundancy decoder 418. Notably, the interleaving redundancy encoder 416 is configured to receive payload bytes at the transmitting network interface 408 and transmit payload bytes over the transmission medium 406 in the same or similar order as received at the network interface 408. Under this condition, if noise 420 corrupts consecutive symbols on the transmission medium 406, the corruption will be confined to a limited number of DTUs rather than spread over numerous DTUs. In order to provide sufficient noise protection, payload bytes are correlated to one another via the redundancy bytes (e.g., Reed-Solomon coded redundancy bytes), which allows for subsequent correction of corrupted payload bytes. Consequently, the spread of non-correctable errors over multiple DTUs is substantially reduced.

To facilitate this functionality, payload bytes are written to the interleaving redundancy encoder 416 and read from the interleaving redundancy encoder 416 in the same manner (e.g., vertically), but redundancy bytes are written to the interleaving redundancy encoder 416 in one manner (e.g., horizontally) and read from the interleaving redundancy encoder 416 in another manner (e.g., vertically). This is shown and discussed in more detail in FIGS. 5-6.

Figure 5:
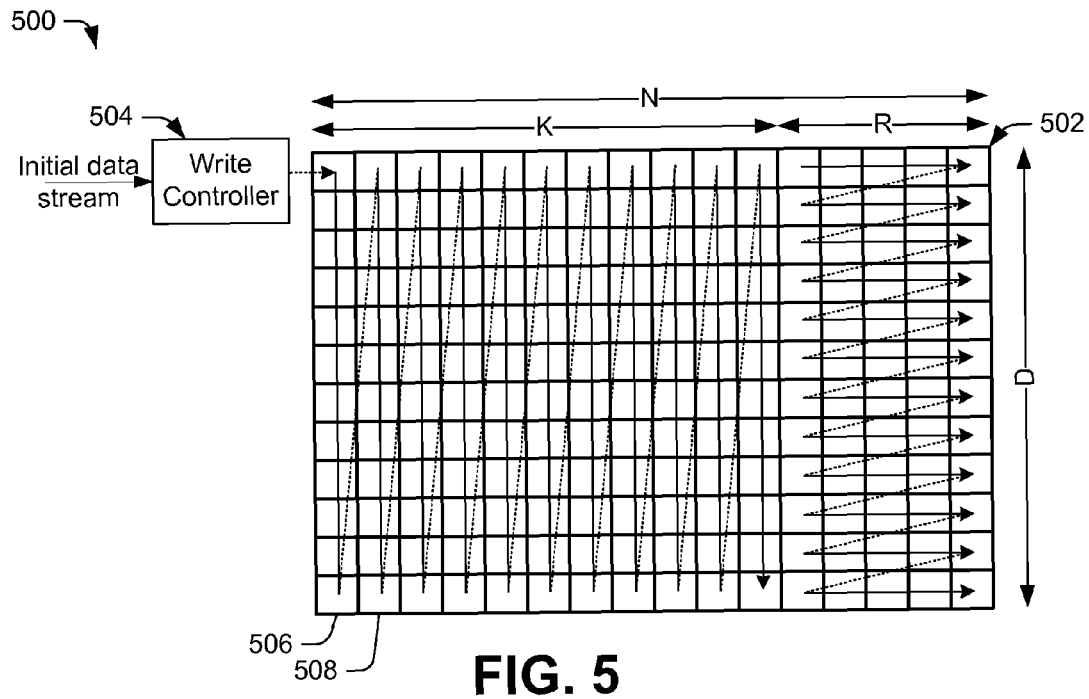
FIG. 5 is a schematic diagram illustrating a write operation to an interleaving redundancy encoder according to one embodiment of the invention.
Figure 6:
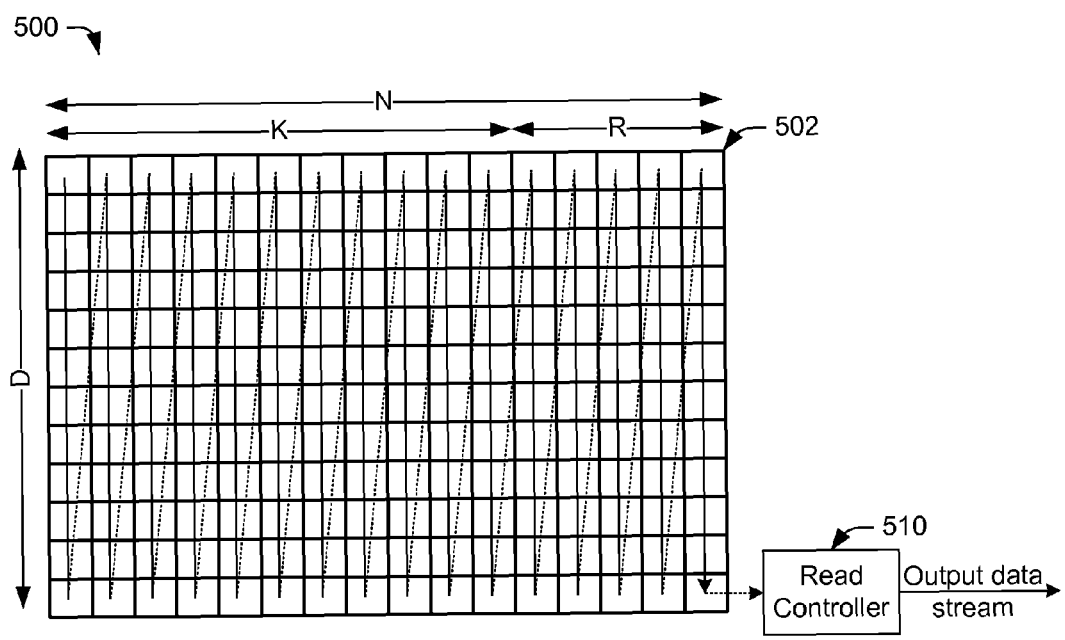
FIG. 6 is a schematic diagram illustrating a read operation from an interleaving redundancy encoder according to one embodiment of the invention.

As shown in FIGS. 5-6, one embodiment of an interleaving redundancy encoder 500 includes a memory unit 502. The memory unit 502 arranges the data in blocks of N columns and D rows, where N corresponds to a virtual codeword length in bytes and D corresponds to an interleaver depth. In general, N and D could be any integer value. Further, K columns are reserved for payload bytes and R columns are reserved for redundancy bytes, where K+R=N. In some embodiments, the memory unit 502 could comprise a memory array, but in other embodiments the memory unit 502 could be other memory configurations or software routines that are well-suited for such data processing.

As shown in FIG. 5, a write controller 504 (e.g., microprocessor, DSP, memory controller, etc.), receives an initial data stream from the transmitting network interface 408 and sequentially writes bytes of the initial data stream into consecutive rows of a first column 506 until the first column is full. After the first column 506 is full, the write controller 504 writes the next bytes in the initial data stream into consecutive rows of the next column 508 until the next column is full, and so on. R redundancy bytes are calculated for each row.

As shown in FIG. 6, a read controller 510 (e.g., microprocessor, DSP, memory controller, etc.) reads from successive columns of the memory unit 502 to form an output data stream. Thus, as shown, the upper-left memory location may be read first, and the lower right memory location may be read last.

Therefore, one can see that in this manner of writing and reading shown in FIG. 5-6, the payload bytes (K) will have the same order in the initial data stream and the output data stream, and the redundancy bytes R will be calculated based on non-consecutive payload bytes from the initial data stream. Further, because the interleaving redundancy encoder 500 includes a memory unit 502, the interleaver depth D can be easily re-configured, as can the other variables N, K, R. Further, because the payload data is passed through the interleaver in the same order, in some embodiments, the memory array may only include R*D bytes instead of a full K*D bytes.

Figure 7A:
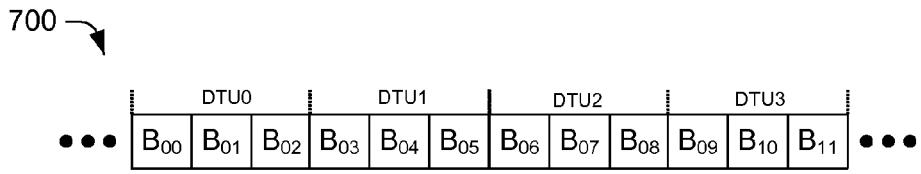
FIG. 7 is a schematic diagram illustrating a more detailed example of a read/write operation in an interleaving redundancy encoder consistent with one embodiment of the invention.
Figure 7B:
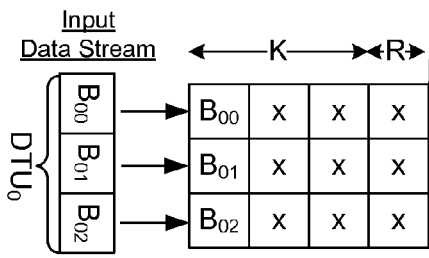
Figure 7C:
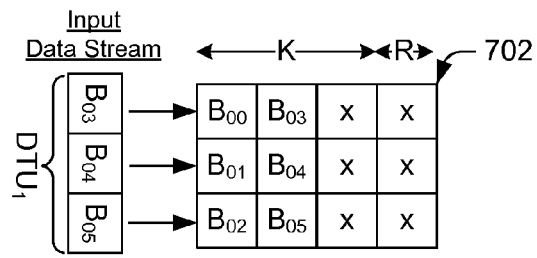
Figure 7D:
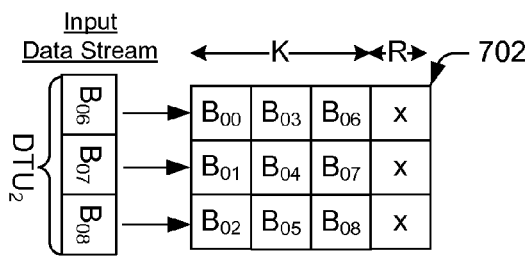
Figure 7E:
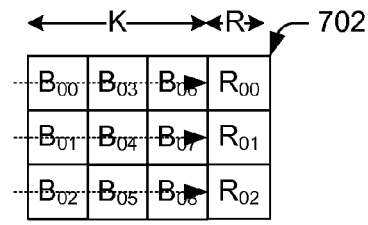
Figure 7F:
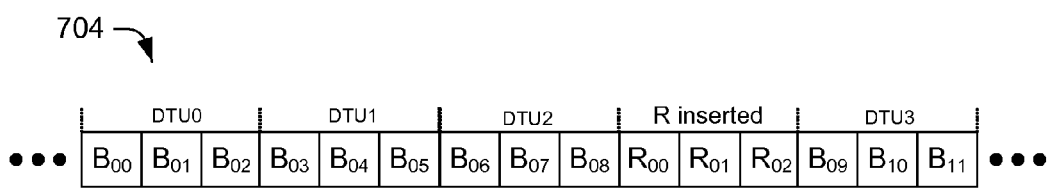

FIGS. 7A-7F and the discussion below show a more detailed example of an initial data stream 700 (FIG. 7A), and how its bytes could be sequentially loaded into a memory unit 702 (FIG. 7B-7D). These figures also show how redundancy bytes R could be calculated (FIG. 7E), and how the output data stream 704 could be formed by sequentially reading from the memory unit 702 (FIG. 7F). Although FIGS. 7A-7F, are shown and discussed with reference to a memory unit 702 having four columns (i.e., N=4, K=3, R=1) and three rows (i.e., D=3), it will be appreciated that the invention extends to any size of memory unit.

Referring now to FIG. 7A, one can see the initial data stream 700 comprises a series of bytes (B) arranged in DTUs. Although FIG. 7 shows DTUs that have 3 bytes, DTUs may in general comprise any number of bits or bytes, and different DTUs may have different lengths.

In FIG. 7B-7D, the DTUs are sequentially written into the memory unit 702. For example, in FIG. 7B, a write controller first loads payload byte $B_{00}$ into the first row of the memory unit 702. Next, the write controller writes $B_{01}$ into the second row of the memory unit 702, after which it writes $B_{02}$ into the third row of the memory unit 702. FIGS. 7C-7D show similar functionality for $DTU_1$ and $DTU_2$, but where the column has been incremented for each DTU. In FIG. 7E, a redundancy byte is calculated for each row. For example, redundancy byte $R_{00}$ is calculated based on payload bytes $B_{00}$, $B_{03}$, and $B_{06}$.

Lastly, in FIG. 7F, a read controller could read from the memory unit to form the output data stream as shown. Thus, the read controller could first read byte $B_{00}$, then read byte $B_{01}$, and so on. Therefore, one can see that reads and writes for payload bytes are carried out in the same direction (e.g., vertically), but writes for redundancy bytes are carried out in one direction (e.g., horizontally) while reads for redundancy bytes are carried out in another direction (e.g., vertically).

A substantial advantage of the system 400 is that non-correctable errors are spread over a limited number of DTUs. This advantageous result may be more fully appreciated in conjunction with FIG. 8 and the discussion below. For the sake of simplicity and clarity, FIG. 8's example has been chosen to be consistent with FIG. 7. However, FIG. 7 merely illustrates one way of implementing the interleaving redundancy encoder 416 and other embodiments could also achieve FIG. 8's characteristics. Further, for the sake of simplicity and clarity, symbols are framed to correspond to a single virtual codeword.

Figure 8:
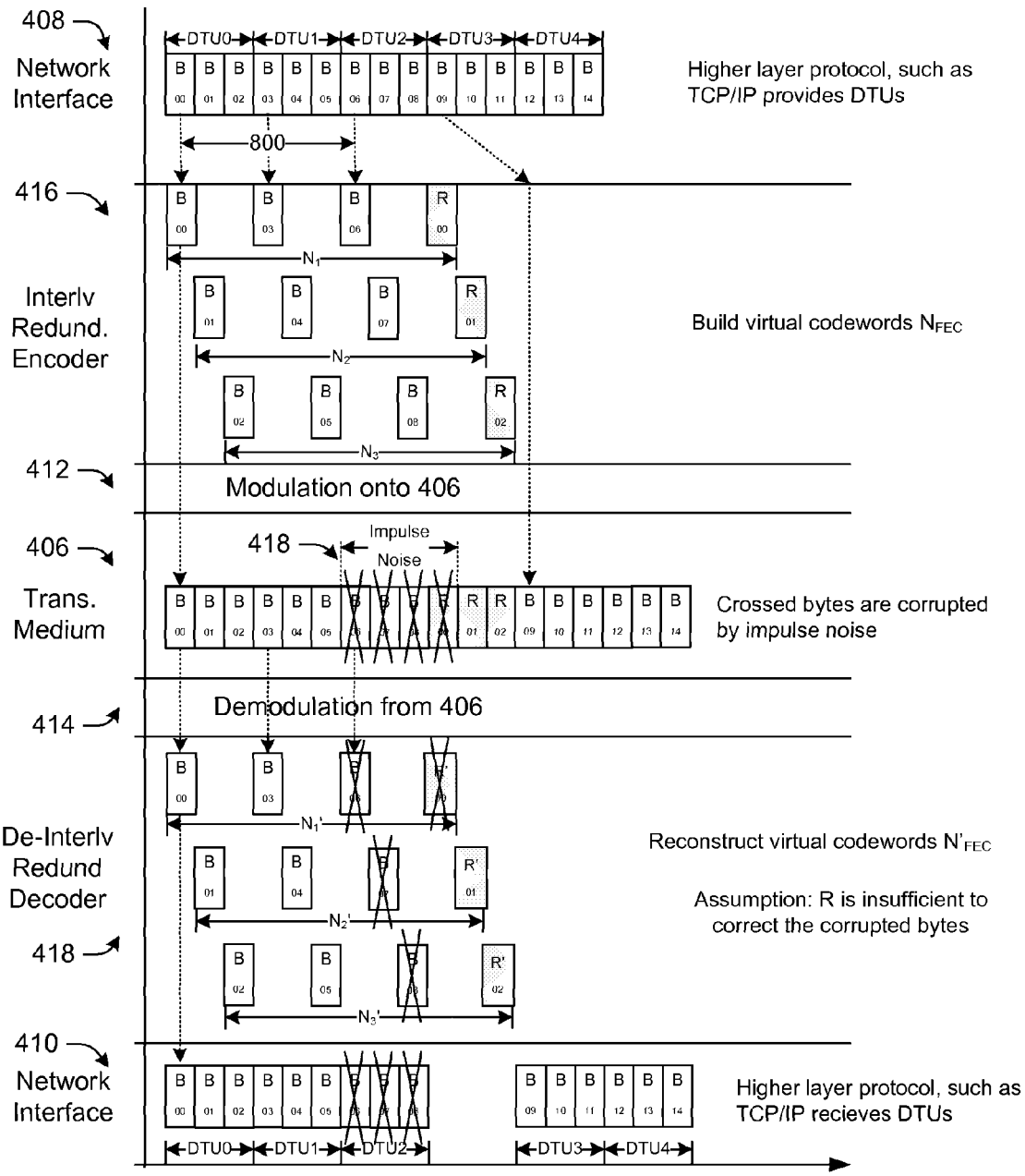
FIG. 8 is a diagram illustrating how an interleaving redundancy encoder can be used in conjunction with a de-interleaving redundancy encoder to prevent an impulse noise disturbance from being spread over multiple data transmission units.

As shown in FIG. 8, the transmitting network interface 408 receives an initial data stream of payload bytes (B) as a series of DTUs. In the interleaving redundancy encoder 416, a write controller could write successive bytes from the initial data stream to a memory unit as previously described. Thus, payload byte $B_{00}$ could be written in a first time cycle, payload byte $B_{01}$ could be written in a second time cycle, and so on. In effect, the interleaving redundancy encoder 416 selects a series of payload bytes from the initial data stream. Redundancy bytes, such as Reed-Solomon redundancy bytes, are then calculated for each series of bytes and associated with the series of bytes to form the virtual codewords $N_1$, $N_2$, $N_3$. Typically, the series of bytes has a total byte length that is less than the span of the series of bytes in the initial data stream. For example, virtual codeword $N_1$ includes a series of bytes ($B_{00}$, $B_{03}$, $B_{06}$) that has a total byte length of 3 bytes and a span 800 of approximately 6 bytes in the initial data stream. Redundancy byte $R_{00}$ is then calculated based on the series of bytes $B_{00}$, $B_{03}$, $B_{06}$, and could be appended to these bytes to form the virtual codeword $N_1$.

Thus, in various embodiments, the interleaving redundancy encoder 416 calculates at least one redundancy byte based on a series of equally spaced, non-consecutive bytes in the initial data stream. The number of bytes between the equally spaced bytes is equal to approximately the number of rows in the memory unit minus one (i.e., D−1).

If hardware accelerators or multiple processors are present, the interleaving redundancy encoder 416 could calculate redundancy bytes for several (e.g., D) virtual codewords in parallel. Thus, if hardware accelerators were used in the illustrated embodiment, $R_{00}$, $R_{01}$, and $R_{02}$ could all be calculated in parallel to minimize delay in the system.

In the illustrated embodiment, the transceiver 412 could receive the initial data stream in the same order as at the transmitting network interface 408, albeit with the redundancy bytes interspersed therein. The transceiver 412 then frames the data stream as a series of symbols, and transmits an outgoing data stream over the transmission medium 406, where bytes in the outgoing data stream have the same order as at the network interface 408. Although the redundancy bytes of consecutive virtual codewords are grouped together in the illustrated embodiment, in other un-illustrated embodiments the redundancy bytes could be evenly interspersed in the data stream so that consecutive symbols include the same number of payload bytes and an equal number of redundancy bytes.

Although the data stream is described as being in "the same order" at the network interfaces 408, 410 and on the transmission medium 406, it will be appreciated that this term includes data that is in a similar order. For example, although the endianess of the bytes is shown as the same between the transmitting network interface 408 and the transmission medium 406, the endianness of the bytes could be flipped. In addition, other modifications to the ordering of the data could be made.

When the data has been transmitted on the transmission medium 406, an impulse noise disturbance 418 could cause all data in a number of consecutive symbols to be corrupted.

After demodulation at the receiver side, the transceiver 414 could pass the received payload bytes directly to the receiving network interface 410 because the received payload bytes are in the desired order. Because the payload data is in the same order, the initial data stream could be transmitted from network interface 408 to network interface 410 with zero effective delay (notwithstanding physical delays in the transmitter due to modulation, calculation of redundancy bytes, etc.) This is advantageous in that it reduces delay and latency over other communication systems.

To facilitate error correction, the received payload bytes are also passed to the de-interleaving redundancy decoder 418. The de-interleaving redundancy decoder 418 then reconstructs the virtual codewords $N_1'$, $N_2'$, and $N_3'$ and calculates redundancy bytes R' based on the received payload bytes, which may or may not be equal to the transmitted payload bytes due to noise on the line. If the calculated redundancy bytes R' are not equal to the received redundancy bytes R, the de-interleaving redundancy decoder 418 can attempt to use the received redundancy bytes R associated with a given virtual codeword to correct the corrupted bytes. Thus, redundancy byte $R_{00}'$ would typically be used to correct any errors that occur in payload bytes $B_{00}$, $B_{03}$, and $B_{06}$.

If we assume that the received redundancy bytes are unable to correct all of the corrupted bytes, then the de-interleaving redundancy decoder 418 can not correct the errors. However, due to the fact that the payload data was transmitted over the transmission medium 406 in the same order as used at the network interfaces 408, 410, the corrupted bytes reside within just one of the DTUs. Consequently, only one of the illustrated DTUs need to be retransmitted. Thus, by using this system 400, higher level protocols can potentially reduce the number of retransmission requests from what was previously achievable.

Figure 9:
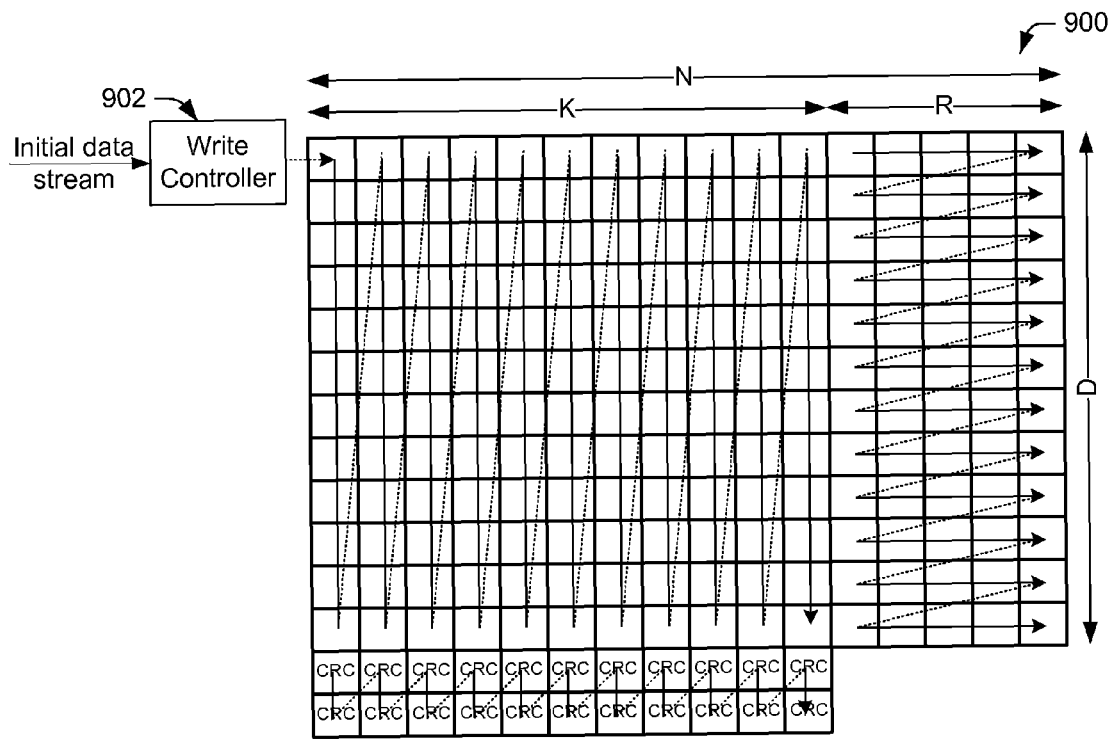
FIG. 9 is a diagram illustrating an embodiment of writing to an interleaving redundancy encoder in which a second redundancy encoder is employed.

Referring now to FIG. 9, one can see another embodiment of an interleaving redundancy encoder 900 in which a first redundancy encoder calculates redundancy bytes along each row and a second redundancy encoder calculates redundancy bytes along each column. Like the interleaving redundancy encoder 500 discussed in FIGS. 5-8, the interleaving redundancy encoder 900 can again transmit data over the transmission medium 406 in the same order as received at the network interface 408 to reduce the number of corrupted DTUs. However, by using first and second redundancy encoders, the interleaving redundancy encoder 900 can use erasure decoding, thereby limiting the total number of redundancy bytes used and reducing the overhead associated therewith.

More specifically, the interleaving redundancy encoder 900 may include a memory unit in row-column format as shown. Like the interleaving redundancy encoder 500, a write controller 902 writes an initial data stream into the memory unit as shown, and redundancy bytes R are calculated for each row. Unlike interleaving redundancy encoder 500, however, a second redundancy encoder calculates redundancy bytes along each column. In various embodiments, the first and second redundancy encoders use different encoding algorithms, although they could use the same algorithm. For example, in one embodiment the first redundancy encoder could use Reed-Solomon encoding while the second redundancy encoder could use a cyclic redundancy check (CRC). Reed-Solomon encoding is relatively computationally complex but can be used to identify and correct bit errors. CRCs, on the other hand, are relatively computationally simple but can only be used to identify bit errors. In other embodiments, other encoding algorithms could be used.

Because impulse noise disturbances often corrupt several consecutive bits of data, errors often extend over several columns. Thus, in FIG. 9's embodiment, the CRCs could be used to easily identify which columns include errors, and erasure decoding could be used in conjunction with the Reed-Solomon encoding to correct the errors. By using this interleaving redundancy encoder 900, one can add more rows to the memory unit while scaling back the number of columns and still retaining the same or similar amount of error correction capability.

On the receiver end, when the data is received it is written into the columns in a column by column manner (similar to FIG. 10, which shows the read controller 904 in the transmitting network device 1000), and the CRC can be calculated for each column as it is received. Thus, if a column of data is received and the CRC is correct, the receiver could forward the data to the receiving network interface without waiting for the redundancy check. As soon as the CRC fails, data will no longer be forwarded to the network interface until the Reed-solomon bytes can be used to correct the data in the column. After the data has been corrected, it can then be forwarded on to the receiving network interface.

Note that it is not necessary that one CRC is calculated for each column of D bytes. Any other spacing could also be used as long as it is not significantly larger than the duration of a typical impulse noise disturbance.

Figure 10:
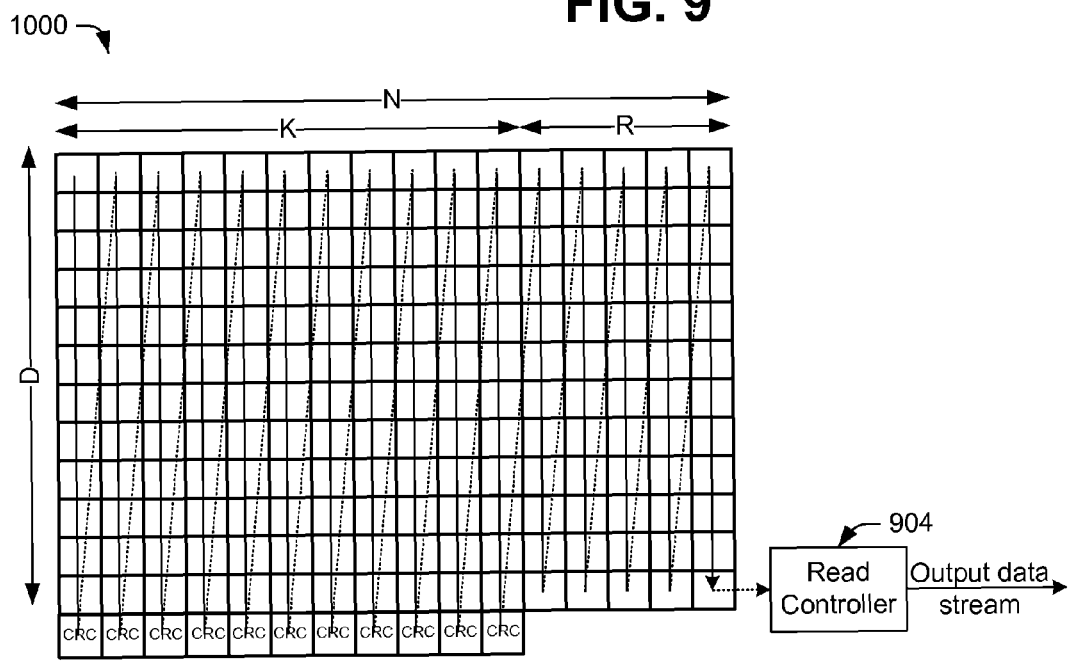
FIG. 10 is a diagram illustrating an embodiment of reading from an interleaving redundancy encoder in which a second redundancy encoder is employed.
Figure 11:
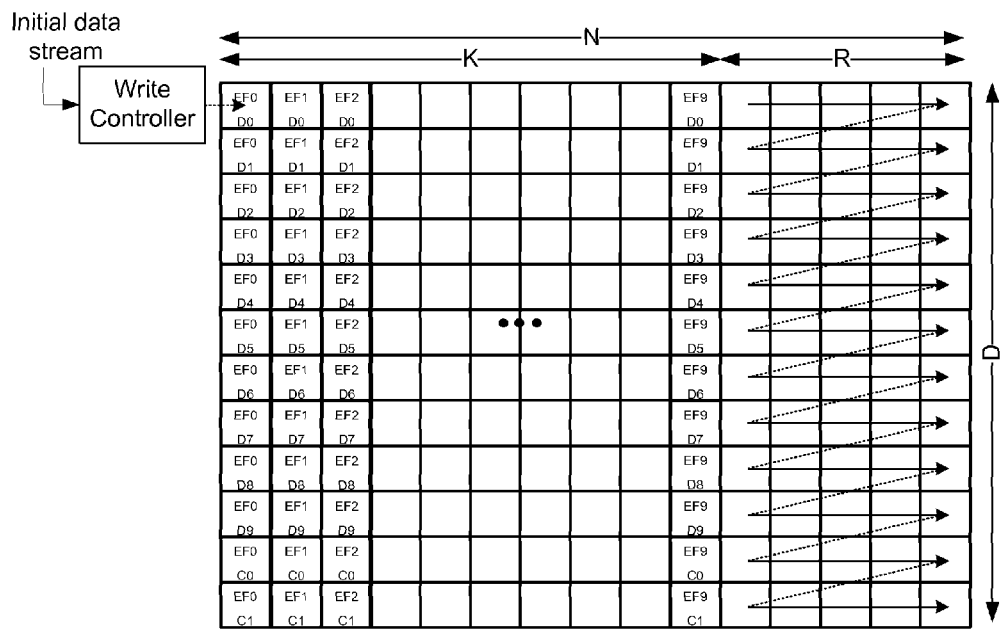
FIG. 11 is a diagram illustrating another embodiment of writing to an interleaving redundancy encoder in which a second redundancy encoder is employed.

In some embodiments, a higher level protocol could calculate CRCs at various intervals in the initial data stream, thereby allowing the system to use the existing CRCs instead of calculating new CRCs. For example, FIG. 11 shows a straightforward example of an interleaving redundancy encoder 1100 that has received an initial data stream from an Ethernet in the First Mile (EFM) technology, where data is grouped in Ethernet fragments of up to 512 bytes. In FIG. 10's example, each Ethernet fragment has the same length and includes a two-byte CRC at the end. The length of each Ethernet Fragment corresponds to the depth D, such that the boundaries of each segment fall along a given column. Thus, in FIG. 11, one can see the unit includes ten Ethernet fragments (EF0 through EF9), each having ten payload bytes (e.g., EF0-D0 through EF0-D9) and two CRC bytes (e.g., EF0-C0 and EF0-C1). Therefore, because the initial data stream already includes CRCs, the interleaving redundancy encoder 1100 will only calculate redundancy bytes, such as Reed-Solomon bytes, along each row (and does not need to calculate CRCs). Because the CRCs are equally spaced, the system can use the CRCs from the higher level protocol in conjunction with the Reed-Solomon bytes to facilitate erasure decoding.

Figure 12:
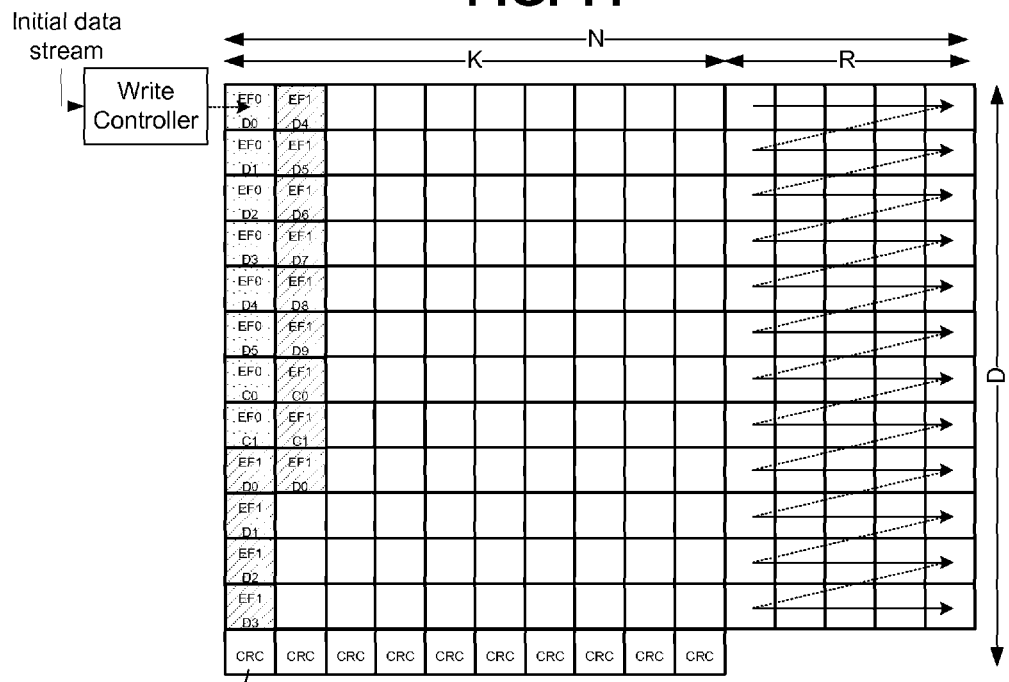
FIG. 12 is a diagram illustrating another embodiment of writing to an interleaving redundancy encoder in which a second redundancy encoder is employed.

FIG. 12 shows another embodiment of an interleaving redundancy encoder 1200 where a higher level protocol, such as EFM, calculates CRCs at different intervals in the initial data stream. Although each Ethernet fragment may have a different length, each Ethernet fragment is still structured to include a two-byte CRC. Thus, in FIG. 12, one can see the unit includes two Ethernet fragments (EF0 and EF) having CRC bytes (EF0-C0, EF0-C1 and EF1-C0, EF1-C1, respectively). Because these CRCs are not equally spaced in the initial data stream, the system is unable to predict precisely where they will occur and they cannot be easily used for erasure decoding. In this case, the interleaving redundancy encoder 1200 may calculate a CRC for column 1202 as shown. To allow for advantageous CRC functionality, the CRC may be calculated along the entire column, but will more preferably be calculated over only the portion of the Ethernet fragment EF1 in the first column. If the CRC checks at the receiver side, the column of data can be passed to the higher level protocol without the need for checking the Reed-Solomon redundancy bytes. The higher level protocol at the receiver side can then verify its own CRCs (EF0-C0 and EF0-C1 and EF1-C0 and EF1-C1) to accurately determine whether retransmission is warranted.

Depending on the implementation, the individual columns could have bytes that uniquely identify that column so that retransmission of only that column can be requested and transmitted. These bytes could take the form of sequence bytes or some other unique identifier.

Although the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A network device, comprising:
 a network interface configured to receive an initial data stream;
 an interleaving redundancy encoder comprising a memory unit that arranges data in N columns and D rows; the interleaving redundancy encoder configured to calculate at least one redundancy byte based on a series of equally spaced, non-consecutive bytes in the initial data stream, where a number of bytes between the equally spaced bytes is equal to D−1.

2. The network device of claim 1, further comprising:
 a transmitter configured to transmit an output data stream over a transmission medium, where consecutive bytes in the output data stream have an order that corresponds to an order of consecutive bytes in the initial data stream.

3. The network device of claim 2, where the initial data stream passes from the network interface to the transmitter with approximately zero effective delay.

4. The network device of claim 2, where the series of bytes and the at least one redundancy byte are associated with a virtual codeword.

5. The network device of claim 4, where redundancy bytes for several virtual codewords are calculated in parallel.

6. The network device of claim 4, where the transmitter is configured to transmit a series of symbols over the transmission medium, each symbol framed to correspond to a unique virtual codeword.

7. An interleaving redundancy encoder adapted to facilitate transmission of data over a transmission medium, comprising:
 a memory unit having a number of memory cells arranged in a number of rows and a number of columns;
 a write controller configured to write payload bytes to the memory unit according to a first pattern, and further configured to write redundancy bytes to the unit according to a second pattern.

8. The interleaving redundancy encoder of claim 7, where the first pattern comprises writing consecutive payload bytes from an initial data stream into consecutively incremented rows of a first column, and then writing the next consecutive payload bytes of the initial data stream into consecutively incremented rows of the next column.

9. The interleaving redundancy encoder of claim 8, where the second pattern comprises writing a redundancy byte based on the payload bytes of a row of the memory unit.

10. The interleaving redundancy encoder of claim 7, further comprising:
 a read controller configured to read the payload bytes from the memory unit according to the first pattern.

11. The interleaving redundancy encoder of claim 10, where the read controller is configured to read the redundancy bytes from the memory unit according to the third pattern.

12. The interleaving redundancy encoder of claim 10, where the read controller is further configured to read the redundancy bytes from the unit according to a third pattern that differs from the second pattern.

13. An interleaving redundancy encoder adapted to facilitate transmission of data over a transmission medium, comprising:
 a memory unit having a number of memory cells arranged in a number of rows and a number of columns;
 a first redundancy encoder configured to calculate at least one redundancy byte based on data values in a row of the memory unit;
 a second redundancy encoder configured to calculate at least one redundancy byte based on data values in a column of the memory unit.

14. The interleaving redundancy encoder of claim 13, where the first and second redundancy encoders use different encoding algorithms.

15. The interleaving redundancy encoder of claim 13, where the first redundancy component uses a first algorithm that provides for error detection and correction, and where the second redundancy component uses a second algorithm that provides for only error detection.

16. The interleaving redundancy encoder of claim 13, where the first redundancy component uses a Reed-Solomon encoding, and where the second redundancy component uses a cyclic redundancy check.

17. A method of data processing, comprising:
- writing an initial data stream to columns and rows of a memory unit according to a first pattern;
- using a first redundancy algorithm to calculate at least one redundancy byte based on data values along a row of the memory unit;
- using a second redundancy algorithm to calculate at least another redundancy byte based on data values along a column of the memory unit, the second redundancy algorithm differing from the first redundancy algorithm.

18. The method of claim 17, further comprising:
transmitting an outgoing data stream over a transmission medium, where the output data stream includes the initial data stream with the at least one redundancy byte and the at least another redundancy byte therein, and where consecutive bytes in the output data stream have an order that corresponds to an order of consecutive bytes in the initial data stream.

19. The method of claim 17, where the first algorithm comprises Reed-Solomon encoding.

20. The method of claim 17, where the second algorithm comprises a cyclic-redundancy check.

* * * * *